United States Patent

Miracky et al.

Patent Number: 5,250,329
Date of Patent: Oct. 5, 1993

[54] METHOD OF DEPOSITING CONDUCTIVE LINES ON A DIELECTRIC

[75] Inventors: Robert Miracky, Cedar Park; Joan E. Yater; Colin A. Mackay, both of Austin, all of Tex.

[73] Assignee: Microelectronics And Computer Technology Corporation, Austin, Tex.

[21] Appl. No.: 976,057

[22] Filed: Nov. 13, 1992

Related U.S. Application Data

[63] Continuation of Ser. No. 697,922, May 2, 1991, abandoned, which is a continuation of Ser. No. 334,036, Apr. 6, 1989, abandoned.

[51] Int. Cl.⁵ .......... B05D 3/06; C23C 16/00; C23C 14/00; H01L 21/306
[52] U.S. Cl. .......... 427/556; 427/553; 427/584; 427/250; 427/253; 156/634; 156/656; 204/192.14; 204/192.17
[58] Field of Search .......... 427/553, 554, 584, 556, 427/582, 124, 125, 98, 99, 250, 253; 156/634, 655, 657; 204/192.14, 192.15, 192.17

[56] References Cited

U.S. PATENT DOCUMENTS

| | | | |
|---|---|---|---|
| 3,801,388 | 4/1974 | Akiyama et al. | 156/634 |
| 3,937,857 | 2/1976 | Brummett et al. | 427/306 |
| 3,954,570 | 5/1976 | Shirk et al. | 427/306 |
| 4,300,474 | 11/1981 | Livsey | 118/641 |
| 4,340,617 | 7/1982 | Deutsch et al. | 427/53.1 |
| 4,404,235 | 9/1983 | Tarug et al. | 427/89 |
| 4,409,262 | 10/1983 | Jelks et al. | 427/99 |
| 4,496,607 | 1/1985 | Mathias | 427/53.1 |
| 4,543,270 | 9/1985 | Oprysko et al. | 427/53.1 |
| 4,568,565 | 2/1986 | Gupta et al. | 427/53.1 |
| 4,579,750 | 4/1986 | Bowen et al. | 427/53.1 |
| 4,584,207 | 4/1986 | Wilson | 427/124 |
| 4,605,566 | 8/1986 | Matsui et al. | 427/99 |
| 4,615,904 | 10/1986 | Ehrlich et al. | 427/53.1 |
| 4,711,790 | 12/1987 | Morishige | 427/53.1 |
| 4,960,613 | 10/1990 | Cole et al. | 427/53.1 |

OTHER PUBLICATIONS

Osaka et al, "Behavior of Evaporated Palladium Catalyst for Electroless Nickel-Phosphorus Film Foundation," Journal of the Electrochemical Society, vol. 132, No. 9, Sep., 1985, pp. 2081-2085.

Flis et al, "Imitation of Electroless Nickle Plating on Copper, Gold and Platinum," Journal of the Electrochecmical Society, vol 131, Feb., 1987, pp. 254-260.

Primary Examiner—Marianne Padgett
Attorney, Agent, or Firm—David M. Sigmond

[57] ABSTRACT

A method of depositing micron-sized metal lines on a dielectric substrate, such as polyimide. The dielectric is covered with a thin metallic layer, of a first metal placed in a reaction cell containing a gas-phase molecular species containing a second metal, and exposed to a focused laser beam. A translation stage moves the dielectric relative to the beam to selectively deposit micron-sized second metal lines on the metallic layer. The metallic layer on the unirradiated portion of the substrate is subsequently etched away, leaving the lines adhered to the dielectric surface.

31 Claims, 1 Drawing Sheet

METHOD OF DEPOSITING CONDUCTIVE LINES ON A DIELECTRIC

CROSS-REFERENCE TO RELATED APPLICATIONS

This is a continuation of U.S. Ser. No. 07/697,922 filed May 2, 1991; which is a continuation of U.S. Ser. No. 07/334,036 filed Apr. 6, 1989 both abandon.

BACKGROUND OF THE INVENTION

The ability to deposit metal onto a substrate in a controlled fashion is desirable for many applications. In particular, the area of solid state circuitry has many ways in which it could utilize new and innovative deposition processes. As the dimensions of devices on integrated circuit wafers continue to shrink, while the overall size and complexity of the wafers increase, there is a growing need to be able to repair or alter an individual wafer in a time efficient, economic, and reliable manner.

The present invention is directed to an improved method for depositing micron-sized for example, 5-20 $\mu$m widths, metal lines on an arbitrary dielectric material which, while providing good nucleation for the deposited metal, does not require additional patterning process steps. In particular, the process is directed to placing metal lines on an underlying polyimide surface in which the deposition does not damage the substrate. The method employs a visible wave length laser which is easily focused, very stable, has high resolution, and operates at power levels which do not harm the underlying substrate. The laser induced chemical vapor deposition process of the present invention exploits the strong, non-linear temperature dependence of the chemical deposition rate for the decomposition of a metal-bearing compound into a solid metallic film.

SUMMARY

The present invention is directed to a method of depositing micron-sized electrically conductive lines on a dielectric substrate which includes covering a dielectric substrate with a metallic layer of a first metal, placing the dielectric with the metallic layer in a reaction cell containing a gas mixture, at least one gas of which is a compound bearing a second metal, and irradiating the metallic layer at select areas with a focused laser beam forming micron-sized lines of the second metal on the metallic layer. Thereafter, the metallic layer on the unirradiated portions of the substrate is etched off of the dielectric surface.

A still further object of the present invention is wherein the gas mixture includes tungsten hexafluoride and hydrogen.

A still further object of the present invention is wherein the gas mixture includes tungsten hexacarbonyl.

A still further object of the present invention is wherein the gas mixture includes one of a class of gaseous organo-metallic compounds containing copper or gold.

A still further object of the present invention is wherein the dielectric is selected from polyimide, silicon dioxide, silicon nitride, or epoxy.

Still a further object of the present invention is wherein the ratio of hydrogen relative to the tungsten hexafluoride ranges from about three to one to one hundred to one. Preferably, the ratio is approximately thirty to one.

Still a further object of the present invention is wherein the thickness of the metallic layer ranges from approximately 100 to 4000 angstroms. Preferably, the metallic layer is selected from titanium, chromium, palladium, tin/palladium, gold, iron or a composite layer of titanium, copper, and titanium.

Other and further objects, features and advantages will be apparent from the following description of a presently preferred embodiment of the invention, given for the purpose of disclosure, and taken in conjunction with the accompanying drawings.

DESCRIPTION OF THE PREFERRED EMBODIMENT

Figure 1:
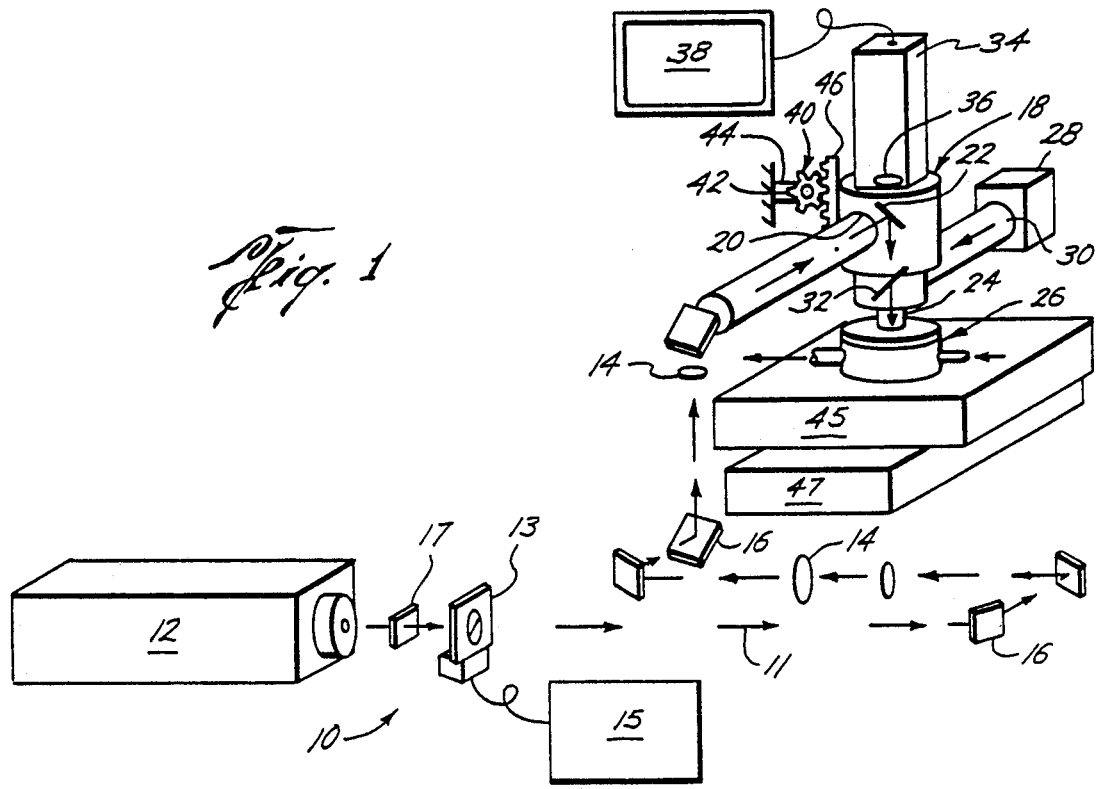
FIG. 1 is a schematic perspective view illustrating an apparatus useful in carrying out the method of the present invention.

Referring now to FIG. 1, there is shown an apparatus for performing the method of the present invention. The apparatus includes a laser system, generally indicated by the reference numeral 10, which is comprised of a laser source 12, which emits a laser beam 11 depicted in the figure by a series of broken arrows, lenses 14 for expanding and focusing the beam 11, and mirrors 16 for reflecting and redirecting the beam. Positioned downstream of the laser source 12 is a mechanical shutter 13 controlled by a shutter controller 15. The shutter controller permits precise setting of pulse conditions. Optionally, a neutral density filter 17 is positioned immediately downstream of the laser source 12.

The beam is directed into and through a microscope 18. The microscope includes a port 20 for receiving the beam and passing the same to a beam splitter 22 positioned centrally within the microscope. A portion of the beam then passes downwardly through the microscope through an objective 24 before passing into the work cell 26.

The microscope also includes an illumination source 28. The illumination source lights the work cell in order that the deposition operation in the work cell can be viewed. A light beam is passed from the source 28 through a second port 30 to a beam splitter 32 and down into the work cell 26. A television camera or film recorder 34 is positioned on a cylinder 36. Attached to the recorder 34 is a projection screen 38 which projects the deposition taking place in the work cell 26.

The microscope is vertically positioned by means of a rack and pinion mechanism 40. The pinion 42 is securely fixed to a mount 44 which, in turn, is fixed at a selected height. The pinion engages a rack 46 mounted on the microscope. Vertical adjustment is achieved by rotating the pinion and thereby engaging the rack to either raise or lower the microscope.

The work cell 26 is securely mounted on translation tables 45 and 47 which displace the work cell in the x, y planes, respectively, relative to the fixed laser beam. The movement of the tables is controlled by a computer control unit (not shown) to displace the work cell so that the laser beam is incident along a predetermined selected path on the surface of a workpiece within the work cell 26. The laser 12 may be any suitable continuous wave laser with a wave length in the range of 200-1400 nm. The laser must be of the "continuous wave" type, so that a smooth, conductive line can be formed. The wave length range is chosen so that there is sufficient absorption of the laser energy in the substrate such as an argon ion laser beam, which may be optically focused to a spot size of approximately 10 microns. This spot size is selected so that the method can be used to form conductive wires connecting circuitry on either integrated circuit chips or multi-chip substrates. Other lasers which are satisfactory are a continuous wave Nd:YAG laser (operating either 1064 or 532 nm), a continuous wave dye laser, or a continuous wave krypton ion laser.

Some types of dielectric substrates such as polyimide, decompose at temperatures lower than about 500° C. However, the present method uses one of the above-named lasers, which are easily focused, very stable, have high resolutions and operate at wave lengths which do not harm dielectrics such as polyimide.

Figure 2:
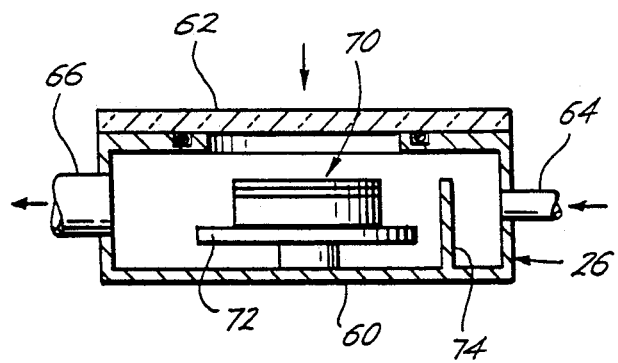
FIG. 2 is an enlarged elevational view of the reaction chamber of the present invention.
Figure 3:
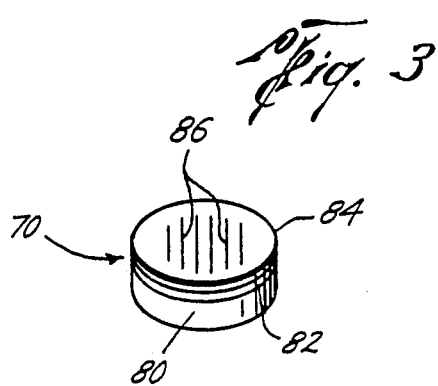
FIG. 3 is an enlarged elevational view of the product produced by the present method.

Referring now to FIGS. 2 and 3, the work cell 26 may include a stainless steel vacuum chamber 60 having a glass plate top 62, a gas inlet 64, and a gas outlet 66 exhaust to a pump (not shown). The reaction cell 26 is filled with predetermined amounts of a reactant gas. In one example, the reactant gas includes tungsten hexafluoride and hydrogen. In another example, the gas includes tungsten hexacarbonyl. In still another example, the gas includes one of a class of gaseous organo-metallic compounds containing copper or gold. The reaction cell 26 might also contain some quantity of an inert buffer gas, such as argon. In the first example, the preferred ratio of hydrogen to tungsten hexafluoride is 30 to 1 although the range may be from about 3 to 1 to 100 to 1. As an example, the total chamber press 30 Torr. The laser induced chemical vapor deposition process exploits the strong, non-linear temperature dependence of the chemical reaction for the reduction of the tungsten hexafluoride to tungsten in the presence of hydrogen. The chemical reaction is as follows:

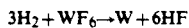

$$3H_2 + WF_6 \rightarrow W + 6HF$$

The sample 70 is placed upon a platform 72 in the work chamber 26. Preferably, the work chamber includes a baffle 74 which insures that the incoming gas mixture flowing from the gas inlet 64 through the work chamber 26 is directed over the sample 70.

Referring now to FIG. 3, the sample 70 includes a substrate 80 having a dielectric layer 82, preferably a coating 20 μm thick layer of polyimide although other types of dielectric layers can be used such as silicon dioxide, silicon nitride, or epoxy. The dielectric layer 82 is covered with a thin metallic layer 84 which serves three purposes: (a) it serves as a nucleation layer for the micron-sized metal lines, (b) it provides a more uniform thermal environment for controlling the metal deposition rate and protecting the underlying dielectric from deformation; and (c) contact resistance between the deposited micron-sized metal lines and underlying layers is reduced. Preferably, the nucleation layer consists of a thin metal layer, approximately 100-4000 angstroms. This layer can be applied in a number of ways: (a) evaporation, (b) sputtering, (c) electroless plating or (d) immersion in a liquid solution containing a surface-activating metal species. There are a number of metals which are acceptable, including titanium, chromium, palladium, tin/palladium, gold, and iron or a composite of layers of titanium, copper, and titanium. However, the metal used to form the thin metallic layer 84 should be different from the metal contained in the gaseous compound, because the subsequent etch process by which the thin metal layer is removed from the unirradiated portions of the sample must not also remove the micron-sized metal lines which were laser-deposited from the gas mixture. It is much easier to use an etch which removes the thin metallic layer, while leaving the micron-sized metal lines intact, if the two metals are dissimilar. In one example, the metal layer 84 consists of a 500 angstroms thick layer of titanium applied through method (b) above. In another example, the layer 84 is in fact a composite of three individual layers consisting of 500 angstroms of titanium, 2500 angstroms of copper and 500 angstroms of titanium, all applied through method (b) above. In a third example, the layer consists of a thin layer of palladium (from $PdCl_2$), tin/palladium (from $SnCl_4 + PdCl_4$), gold (from $AuCl_6$), or iron (from $FeCl_3$), applied through method (d) above. While the exact process by which the thin metal layer is deposited on the substrate in these latter cases is not well understood, it has been observed for similar processes [see, for example, T, Osaka, I. Kaiwa, and L. Svendsen, J. of Electrochemical Society, Vol. 132, p. 2081 (1985), and J. Flis and D. J. Duquette, J. of Electrochemical Society, Vol. 131, p. 254 (1984)] that the activator compounds decompose on contact with the surface, forming metal clusters approximately 1 or 2 atoms thick and up to 0.5 micron in diameter. These clusters increase the surface conductivity of the dielectric substrate. When this process is followed by electroless deposition of metals, the clusters grow across the surface until they coalesce. A similar mechanism is likely to hold when laser chemical vapor deposition is used instead of electroless deposition, as is the case here. For the cases in which the surface-activating metal compound contains metal cations such as $Pt++$ and $Pd++$, and the dielectric surface is polyimide, this process might also be enhanced by first treating the surface of the polyimide by immersing it into an ethylenediamine solution containing Zintl anions, such as, $K_4Pb_9$, $K_4SN_9$, or $K_3SN_7$. After depositing the micron-sized metal lines 86 on the metal layer 84 using the focused visible laser 12 to induce a localized chemical vapor deposition process, a selective etch is performed on the thin metallic layer 84 between the metal lines 86. That is, in the first example, after the desired deposition of the tungsten lines 86 has been performed, the sample 70 is immersed in an etchant solution which removes the thin nucleation layers while leaving the tungsten lines 86 unaffected. For example, HF, ammonium persulfate and hydrochloric acid are suitable etchants for titanium. copper and palladium, respectively.

In carrying out the method of the present invention, the sample 80 is coated with a dielectric layer 82, preferably polyimide, followed by any suitable metal layer 84 as described above. The sample 70 is then placed in the work cell 26 and the gas inlet 64 and outlet 66 are suitably connected to fill the reaction chamber 60 with a predetermined mixture of reactant gases. In one example, the gas mixture includes tungsten hexafluoride and hydrogen. In another example, the gas mixture includes tungsten hexacarbonyl. In still another example, the gas mixture includes one of a class of gaseous organo-metallic compounds containing copper or gold. The laser beam 11, is optically focused to a spot size of approximately 10 μm on the metal surface 84 and a computer controls the translation tables 45 and 47 so that the laser chemical vapor deposition process proceeds at selected areas. The presence of the metal layer 84 speeds the deposition of the micron-sized metal lines 86. Furthermore, the lines 86 adhere well to the heated metal surface 84. By linearly translating the sample 70 as the laser beam impinges upon the metal surface 84, a continuous line of metal can be drawn, whose dimensions are typically 1–5 μm thick and 5–20 μm wide. After the desired metal depositions 86 have been formed, the sample 70 is immersed in a suitable etch solution as described above to remove the thin nucleation metal layer on the unirradiated portions of the substrate while leaving the micron-sized lines 86 unaffected.

In summary, the method of the present invention is particularly useful for the maskless deposition of micron-thick metal lines on a polyimide surface by a laser induced chemical vapor deposition process. The deposition does not damage the polyimide substrate and the process is more economical than other processes.

The present invention, therefore, is well adapted to carry out the objects and attain the ends and advantages mentioned, as well as others inherent therein. While presently preferred embodiments of the invention have been described for the purpose of disclosure, numerous changes in the details of construction, arrangement of parts, and steps of the method, may be made without departing from the spirit of the present invention and the scope of the appended claims.

What is claimed is:

1. A method of depositing electrically conductive lines on a dielectric substrate, comprising the steps of:
   covering a dielectric substrate with a continuous metallic layer of a first metal, the first metal being adherent to the substrate;
   placing the substrate with the metallic layer thereon into a reaction cell containing a gas mixture, at least one gas of which is a compound bearing an electrically conductive second metal different from the first metal, wherein the metallic layer provides a nucleation layer for the second metal;
   irradiating the metallic layer at selected portions with a focused laser beam to form continuous, electrically conductive second metal lines at least one micron thick on top of the metallic layer wherein during irradiation the metallic layer provides a more uniform thermal environment which protects the underlying dielectric from deformation; and
   chemically etching the metallic layer so as to remove the metallic layer from the unirradiated portions of the substrate while leaving the second metal lines intact.

2. The method of claim 1 wherein the metallic layer is applied to the dielectric substrate by electroless plating.

3. The method of claim 1 wherein the metallic layer is applied to the dielectric substrate by immersion in a liquid solution containing a surface-activating metal species.

4. The method of claim 1 wherein the dielectric is polyimide.

5. The method of claim 1 wherein the dielectric is selected from polyimide, silicon dioxide, silicon nitride, or epoxy.

6. The method of claim 1 wherein the metallic layer is selected from titanium, chromium, palladium, tin/palladium, gold, iron or a composite layer of titanium, copper and titanium.

7. The method of claim 6 wherein the thickness of the metallic layer ranges from approximately 100 to 4000 angstroms.

8. The method of claim 1 wherein the gas mixture includes tungsten hexafluoride and hydrogen.

9. The method of claim 1 wherein the gas includes tungsten hexacarbonyl.

10. The method of claim 1 wherein the gas includes one of a class of gaseous organo-metallic compounds containing copper or gold.

11. The method of claim 1 wherein the second metal lines are at least 5 microns wide.

12. The method of claim 11 wherein the second metal lines in the range of 5–20 microns wide.

13. The method of claim 11 wherein the second metal lines are in the range of 1–5 microns thick.

14. The method of claim 12 wherein the second metal lines are in the range of 1–5 microns thick.

15. The method of claim 1 wherein the chemical etching leaves the second metal lines unaffected.

16. The method of claim 1 wherein the second metal lines and the unetched first metal therebeneath form the final lines on the substrate.

17. The method of claim 1 wherein the second metal lines form conductive wires connecting circuitry on integrated circuit chips.

18. The method of claim 1 wherein the second metal lines form conductive wires connecting circuitry on multi-chip substrates.

19. The method of claim 1 wherein the metallic layer is applied to the dielectric substrate by evaporation.

20. The method of claim 1 wherein the metallic layer is applied to the dielectric substrate by sputtering.

21. The method of claim 1 wherein the irradiation is provided by a continuous wave laser beam.

22. The method of claim 21 wherein the laser beam is operated at a wavelength which does not harm the dielectric.

23. The method of claim 22 wherein the wavelength is in the range of 200–1400 nm.

24. The method of claim 21 wherein the dielectric decomposes at a temperature lower than about 500° C.

25. The method of claim 24 wherein the second metal is tungsten.

26. The method of claim 25 wherein the gas mixture includes an inert buffer gas.

27. The method of claim 25 wherein the gas includes tungsten hexacarbonyl.

28. The method of claim 25 wherein the gas mixture includes tungsten hexafluoride and hydrogen.

29. The method of claim 28 wherein the ratio of hydrogen to tungsten hexafluoride is in the range of 3 to 1 to 100 to 1.

30. The method of claim 29 wherein the ratio of hydrogen to tungsten hexafluoride is 30 to 1.

31. The method of claim 30 wherein the total chamber pressure in the reaction cell during irradiation is 30 Torr.

* * * * *